United States Patent [19]
Ochi

[11] Patent Number: 5,248,347
[45] Date of Patent: Sep. 28, 1993

[54] SOLAR CELL

[75] Inventor: Seiji Ochi, Itami, Japan

[73] Assignee: Mitsubishi Denki Kabushiki Kaisha, Tokyo, Japan

[21] Appl. No.: 831,921

[22] Filed: Feb. 6, 1992

[30] Foreign Application Priority Data

May 17, 1991 [JP] Japan .................. 3-142499

[51] Int. Cl.⁵ .................. H01L 31/06; H01L 31/0224
[52] U.S. Cl. .................. 136/256; 136/262; 257/457; 257/459; 257/773; 257/775; 257/923
[58] Field of Search .............. 136/256, 262; 357/30 J, 357/30 Q, 65, 68; 257/457, 459, 773, 775, 923

[56] References Cited

U.S. PATENT DOCUMENTS

| | | |
|---|---|---|
| 3,982,964 | 9/1976 | Lindmayer et al. ........ 136/256 |
| 4,248,675 | 2/1981 | Bozler et al. ............ 205/157 |
| 4,301,322 | 11/1981 | Amick ................... 136/256 |
| 5,131,933 | 7/1992 | Flödl et al. ............ 136/256 |

FOREIGN PATENT DOCUMENTS

| | | | |
|---|---|---|---|
| 59-211290 | 11/1984 | Japan | 136/256 |
| 63-119273 | 5/1988 | Japan | 136/256 |
| 1-165178 | 6/1989 | Japan | 136/256 |
| 2-218176 | 8/1990 | Japan | 136/244 |

OTHER PUBLICATIONS

Kirkby et al, "Photoelastic Waveguides and Their Effect On Stripe-Geometry GaAs/Ga$_{1-x}$Al$_x$As Lasers", Journal of Applied Physics, vol. 50, No. 7, 1979, pp. 4567-4579.

Primary Examiner—Aaron Weisstuch
Attorney, Agent, or Firm—Leydig, Voit & Mayer

[57] ABSTRACT

In a semiconductor device having a metal electrode on a crystalline semiconductor surface, the metal electrode includes first portions electrically and mechanically connected to the surface and second portions mechanically separated from the surface and having configurations that easily deform. These first and second portions are alternatingly arranged on the surface. Accordingly, stress applied to the semiconductor beneath the electrode is reduced and deformation of the semiconductor element due to thermal stress is prevented, thereby preventing deterioration of element characteristics.

8 Claims, 11 Drawing Sheets

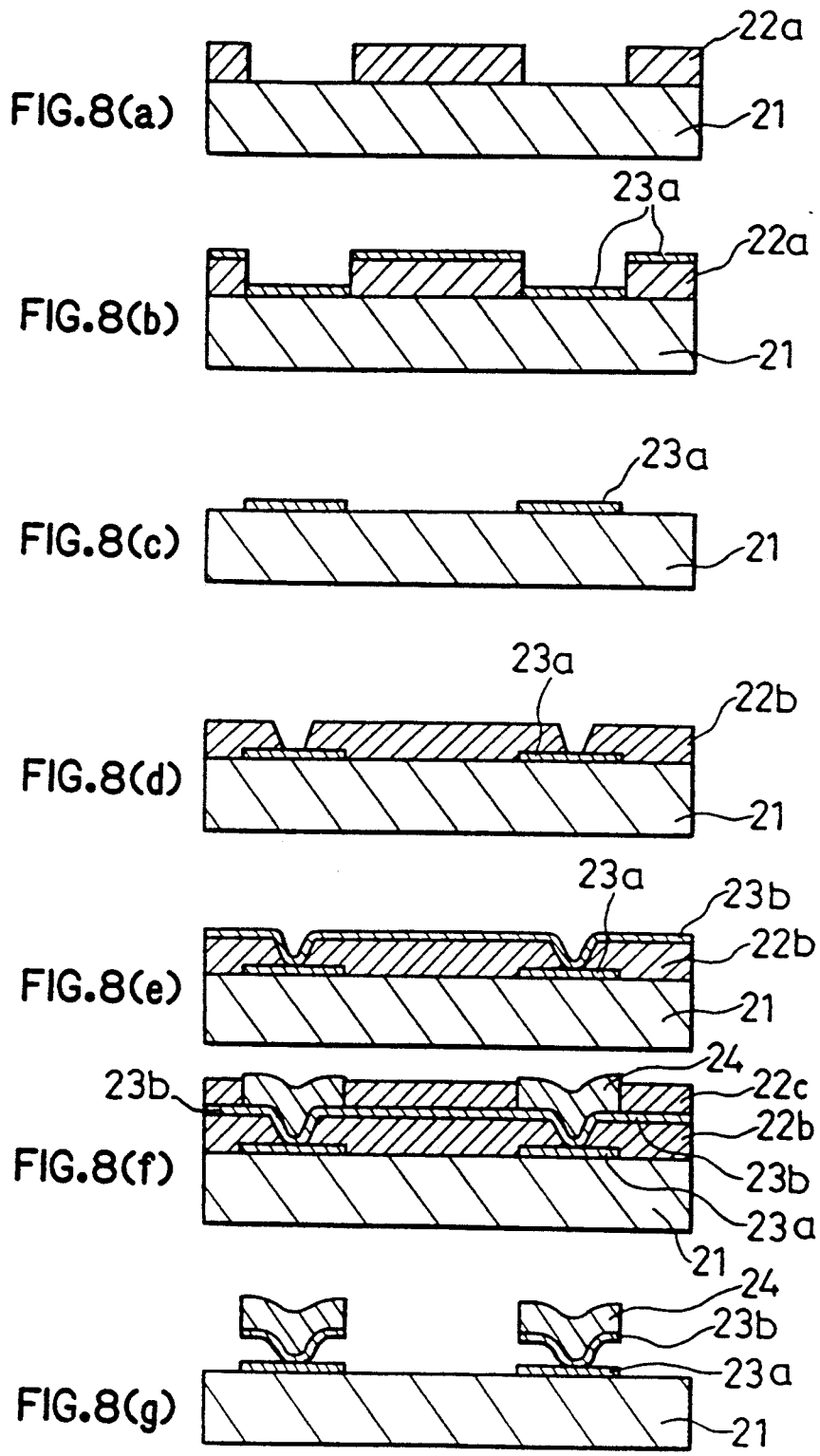

SOLAR CELL

FIELD OF THE INVENTION

The present invention relates to a semiconductor device wherein the stress that is applied by a surface electrode to a semiconductor layer beneath the surface electrode.

PRIOR ART

FIG. 12 is a diagram showing a structure of a prior art GaAs on Si substrate solar cell, in which FIG. 12(a) is a plan view, FIG. 12(b) is a cross-sectional view taken along a line XIIb—XIIb of FIG. 12(a), and FIG. 12(c) is a cross-sectional view taken along a line XIIc—XIIc of FIG. 12(a). In these figures, reference numeral 4 designates an n type Si substrate. An n type GaAs layer 3 is disposed on the substrate 4 and a p type GaAs layer 2 is disposed on the n type GaAs layer 3. A rear surface electrode 5 is disposed on the rear surface of the substrate 1 and a surface electrode 1 is disposed on the p type GaAs layer 2. The surface electrode 1 comprises a plurality of grid electrodes 6 and a common bus 7. The grid electrodes 6 each having a width w are parallel and spaced apart at an interval d.

A description is now given of its operation.

Solar light which is incident on the surface of the solar cell is absorbed by the GaAs layer, generating charge carriers. These carriers generate a photoelectromotive force by the the p-n junction in the GaAs layer and are taken out as a photocurrent through the metal electrodes on the upper surface and the rear surface of the solar cell.

Attention is now given to the metal electrode formed on the surface of the solar cell. This metal electrode collects the photocarriers generated in the p type GaAs layer over the entire surface of the solar cell and guides them to one location. More specifically, in the solar cell having a comb-shaped electrode structure shown in FIG. 12, each grid electrode 6 collects current from the p type GaAs layer 2 and guides the current to the base of the comb. The bus 7 further collects the current from each grid electrode 6 to one location. This bus 7 also serves as a terminal on which a conductor for connecting the solar cell with external circuits is provided.

On the other hand, since metal reflects light without transmitting the same, the metal electrode on the surface of the device decreases the amount of light incident on the GaAs layer.

Accordingly, in a design for a pattern configuration and the thickness of the surface electrode, an optimization is necessitated within the restrictions described below.

(1) The electric resistance is reduced to decrease the loss due to the voltage drop caused by the current flowing through the metal electrode.

(2) The electric resistance between the semiconductor and the metal is reduced. In other words, the contact area of the semiconductor with the metal is increased.

(3) In order to efficiently collect carriers diffusing through the GaAs layer, the interval between adjacent grid electrodes is optimized.

(4) In order to avoid a reduction in efficiency due to the reflection of the incident light, the electrode area is made as small as possible.

As an example of electrode structure which is optimized for a GaAs on Si solar cell having an area of 2 cm × 2 cm, with the electrode pattern shown in FIG. 12, the grid electrode width w is 20 microns, the grid electrode interval d is 1 mm, and the electrode thickness is 4 microns. In this case, copper is used for the electrode metal.

In the prior art GaAs on Si substrate solar cell constituted as described above, the electrode metal applies a thermal stress to the GaAs layer beneath the electrode mainly caused by differences in thermal expansion coefficients between the surface electrode, the GaAs layer, and the Si substrate. This stress causes cracks in the GaAs layer and deterioration in crystalline quality, resulting in reduced efficiency. In addition, the stress also causes deformation of the element.

A GaAs on Si solar cell having high efficiency and a light weight is promising as a solar cell used in space, i.e., a solar cell used for an artificial satellite. However, the temperature varies significantly in the space environment and the solar cell is thought to be exposed to a thermal cycle in a range of +60° C. to −150° C. In such an environment, the above-described problems caused by thermal stress are more serious. Actually, as a result of a thermal cycle test in a range of +150° C. to −190° C., it is confirmed that the above-described reduction in efficiency, deformation of the solar cell or the like due to the thermal stress caused by the variation in temperature is so large that they are problems in practical use of the solar cell.

SUMMARY OF THE INVENTION

It is an object of the present invention to prevent deformation of the element because of the thermal stress applied by the electrode and to prevent cracking occurring accompanying the deformation of the element.

It is another object of the present invention to prevent the deterioration of semiconductor crystals by decreasing the amount of stress that is applied to the GaAs layer by the electrode and to prevent cracking caused by the stress.

In accordance with a first aspect of the present invention, in a semiconductor device having a metal electrode formed on a crystalline semiconductor surface, the metal electrode comprises portions electrically connected with the crystalline surface and portions electrically separated from the crystalline surface and having configurations that enable easy deformation of the entire electrode metal. These respective portions are alternatingly arranged on the surface of the semiconductor. Therefore, the stress generated in the electrode metal is absorbed by the deformation of the electrode metal portions which are separated from the crystal surface thereby preventing deformation of the element.

In accordance with a second aspect of the present invention, in a semiconductor device having a metal electrode formed on a crystalline semiconductor surface, the metal electrode comprises a thin film metal disposed directly on the surface, an electrode metal having a large cross-section, and a metal part narrower than the thin film metal, which electrically connects the thin film metal with the electrode metal. Therefore, when a difference in deformation between the semiconductor part and the metal electrode part arises such as by a variation in temperature, the distortion is absorbed by the thin metal part which electrically connects the thin film metal with the electrode metal, whereby the stress generated in the semiconductor applied from the electrode metal is reduced.

BRIEF DESCRIPTION OF THE DRAWINGS

FIGS. 8(a) to 8(g) are cross-sectional views illustrating an example of a method for producing an upper electrode of the solar cell of FIG. 7;

DETAILED DESCRIPTION OF THE PREFERRED EMBODIMENTS

Embodiments of the present invention will be described in detail with reference to the drawings.

Figure 1A:
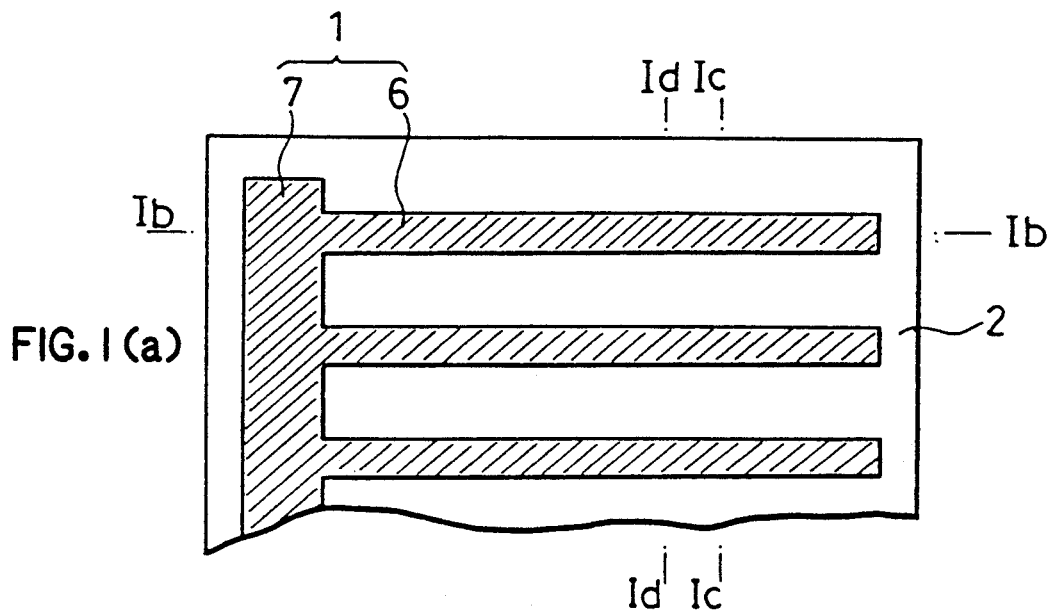
FIGS. 1(a) to 1(d) are a plan view and cross-sectional views showing a GaAs solar cell on a Si substrate in accordance with a first embodiment of the present invention.
Figure 1B:
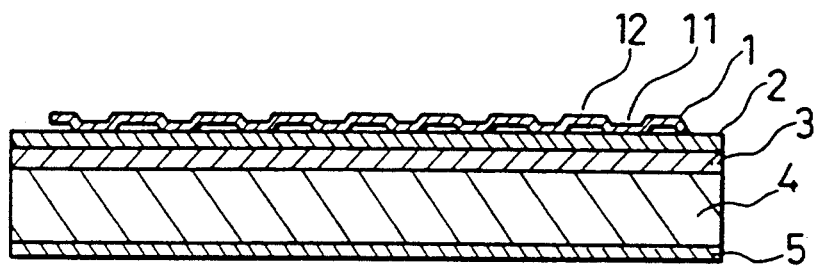
Figure 1C:
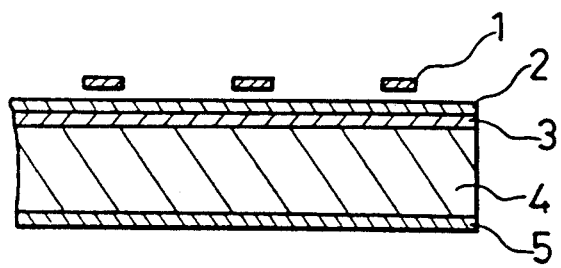
Figure 1D:
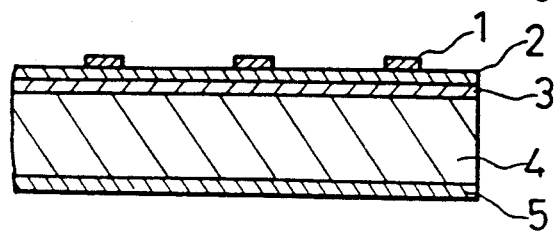

FIG. 1(a) is a plan view showing a GaAs on Si solar cell in accordance with a first embodiment of the present invention, and FIGS. 1(b) to 1(d) are cross-sectional views taken along lines Ib—Ib, Ic—Ic and Id—Id of FIG. 1(a), respectively. In these figures, reference numeral 4 designates an n type Si substrate. An n type GaAs layer 3 is disposed on the substrate 4. A p type GaAs layer 2 is disposed on the n type GaAs layer 3. A rear surface electrode 5 is disposed on the rear surface of the substrate 1 and a surface electrode 1 is disposed on the p type GaAs layer 2. The surface electrode 1 comprises a plurality of grid electrodes 6 and a common bus 7. The grid electrodes 6 each having a width w are arranged parallel to each other and spaced at an interval d. Reference numeral 11 designates portions of the surface electrode 1 which are physically and electrically connected to the semiconductor layer 2 and reference numeral 12 designates portions of the surface electrode 1 which are physically and electrically separated from the semiconductor layer 2.

Figure 5A:
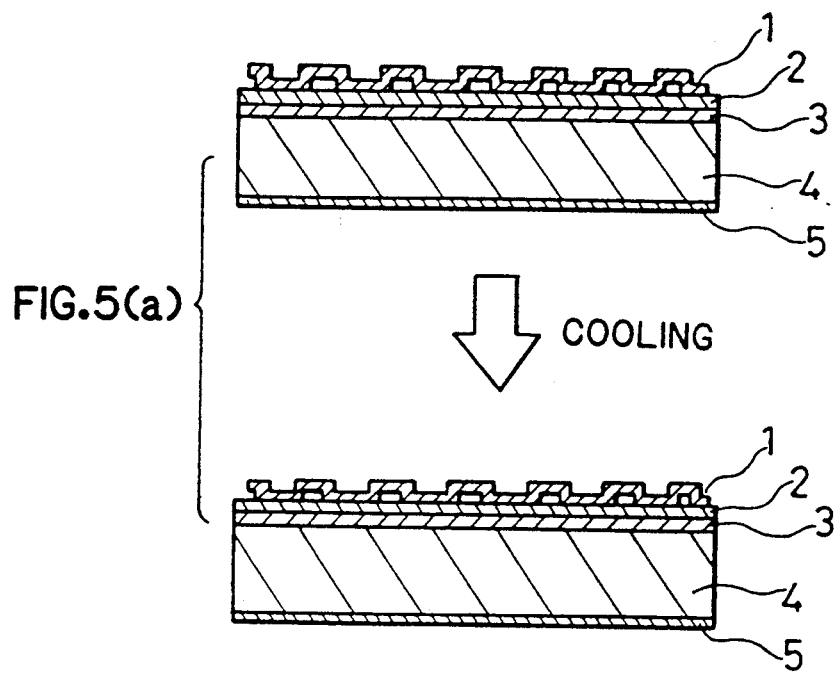
FIGS. 5(a) and 5(b) are cross-sectional views each showing a configuration of an element when it is cooled in a comparison between the first embodiment of the present invention and the prior art.
Figure 5B:
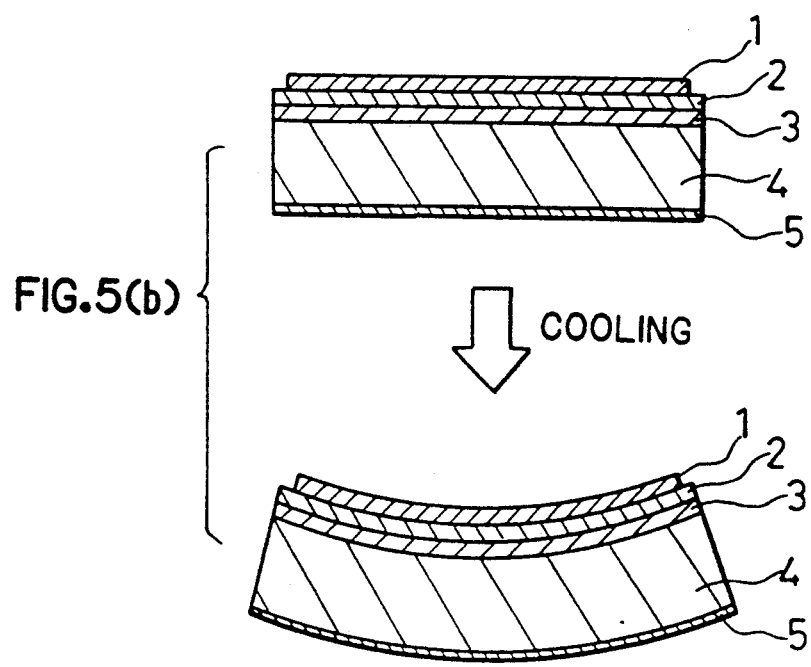
Figure 6A:
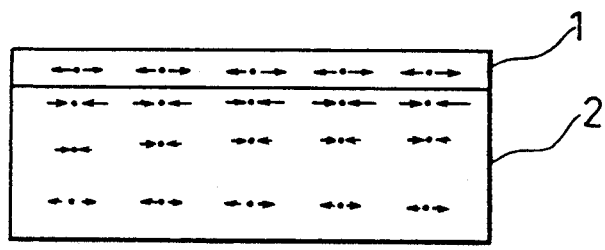
FIGS. 6(a) and 6(b) are cross-sectional views each showing a distribution of stress which is applied to an electrode metal and a semiconductor layer in a comparison between the first embodiment of the present invention and the prior art.
Figure 6B:
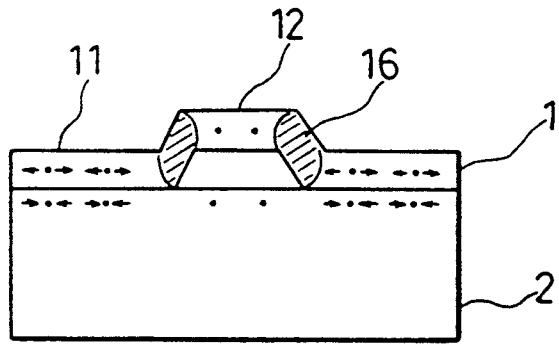

The function of the first embodiment of the present invention will be described hereinafter in comparison with the prior art. FIGS. 5(a) and 5(b) are schematic diagrams each showing cross-sectional views of solar cells at room temperature and cooled down to liquid nitrogen temperature, with attention on an effect of the surface electrode. FIG. 5(a) shows the first embodiment of the present invention and FIG. 5(b) shows the prior art. FIGS. 6(a) and 6(b) are schematic diagrams each showing a stress applied to the semiconductor layer 2 and the upper electrode 1 when the element is cooled in FIGS. 5(a) and 5(b), in which FIG. 6(a) shows the prior art and FIG. 6(b) shows the first embodiment of the present invention.

In a case where the surface electrode is a copper electrode, its thermal expansion coefficient is $20 \times 10^{-6}$/k in the vicinity of room temperature while a thermal expansion coefficient of the GaAs layer beneath the electrode is $5.7 \times 10^{-6}$/k, that is, less than one-third of that of the surface electrode. Therefore, when the element having the conventional electrode structure which is flat at room temperature is cooled, the element warps because the shrinkage of the electrode is larger than that of the semiconductor layer as shown in FIG. 5(b).

This will be described from a view of the stress. Here, it is supposed that an Ag electrode 1 is disposed on the GaAs substrate 2. In a case where the Ag electrode 1 is attached to the entire surface of the substrate 2 as shown in FIG. 6(a), when the element is cooled down from a room temperature, Ag is likely to shrink more than GaAs, whereby a tensile stress arises in Ag because Ag is pulled by the GaAs, which deforms less. On the other hand, since the GaAs beneath the electrode is shrunk by the deformation of Ag, a compressive stress is applied to the GaAs. This compressive stress decreases with distance from the electrode in the thickness direction of the substrate and becomes a tensile stress at the rear surface of the substrate. As a result of the distribution of stress in the substrate thickness direction, the element deforms into a concave shape viewed from the electrode side.

In an element having an electrode structure according to the first embodiment of the present invention, a portion of the stress generated in the metal electrode due to variations in the temperature of the element is relieved by the portions 16 of the electrode portion 12 separated from the semiconductor layer which deform in a longitudinal direction of the electrode as shown in FIG. 6(b). Therefore, no stress is applied to the semiconductor layer beneath the electrode portion 12 separated from the substrate. By alternatingly arranging regions where no stress is applied, the stress applied to the semiconductor layer can be reduced and deformation of the element can be prevented. Accordingly, when the element of the first embodiment which is flat at room temperature is cooled, the amount of deformation is small as shown in FIG. 5(a). When the ratio of the portions 12 separated from the semiconductor surface to the whole length of the electrode is increased, the effect of preventing element deformation is enhanced. In the solar cell shown in the prior art, the upper limit of the ratio of the portions 12 of the grid part of the electrode is determined by the restriction on the contact resistance between the semiconductor and the metal. This ratio can be approximately 70% without deteriorating the element characteristics and this is effective for preventing deformation of element. In addition, by this effect, cracks caused by the stress and deformation of element can be prevented in the GaAs on Si solar cell.

Figure 2A:
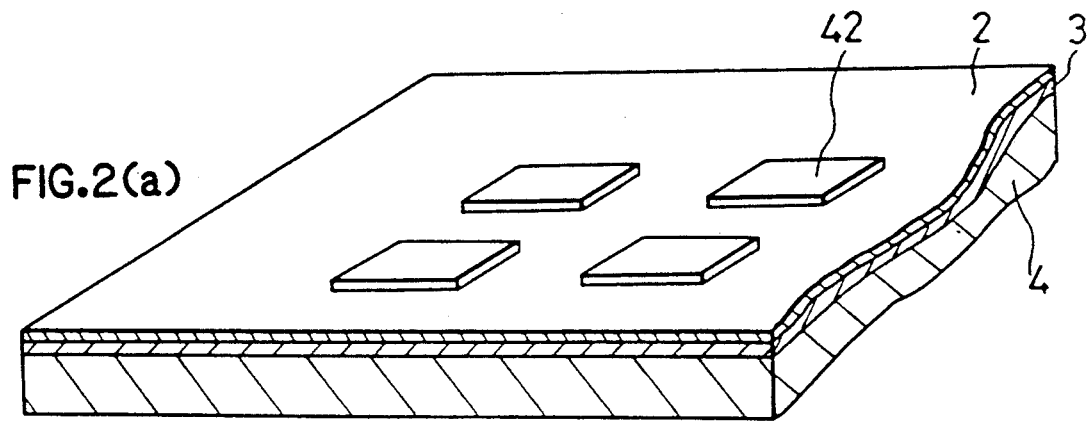
FIGS. 2(a) to 2(c) are perspective views with cross-sections illustrating an example of a method for producing an upper electrode of the solar cell of FIG. 1(a)
Figure 2B:
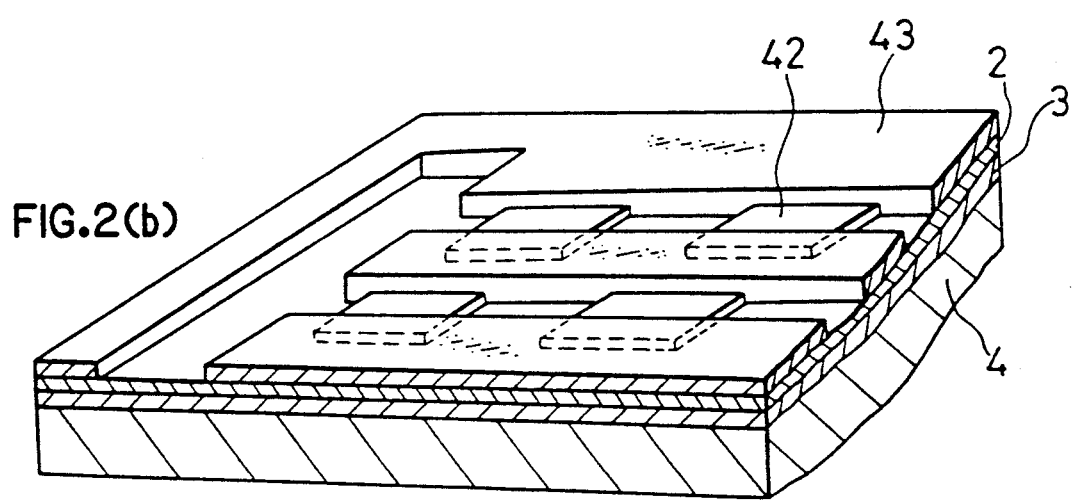
Figure 2C:
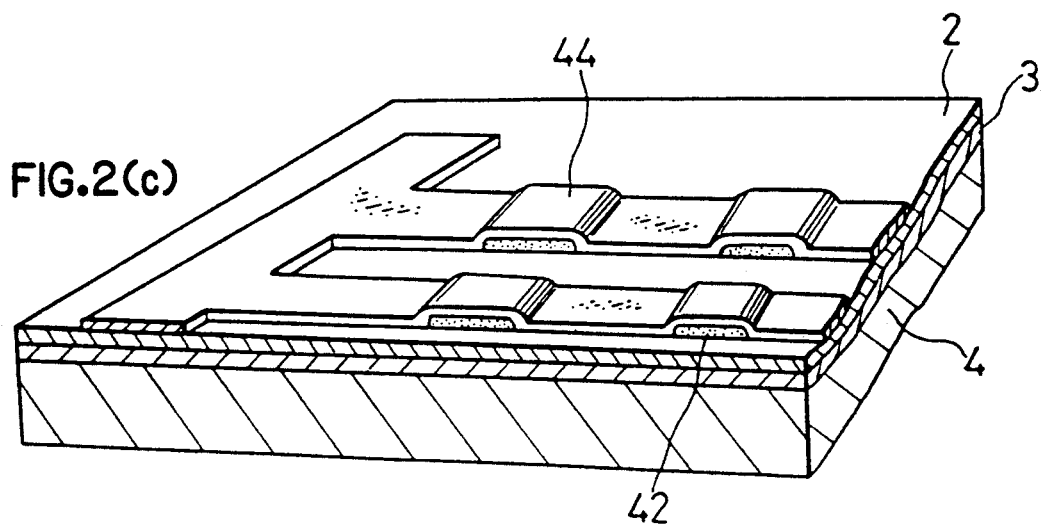

A description is hereinafter given of the production process. FIGS. 2(a) to 2(c) are perspective views having cross-sections illustrating an example of a method for producing the surface electrode of the solar cell of FIG. 1(a). In these figures, the same reference numerals as those shown in FIG. 1(a) designate the same or corresponding parts. Reference numerals 42 and 43 designate resists and numeral 44 designates an Ag film which becomes a surface electrode.

After successively forming an n type GaAs layer 3 and a p type GaAs layer 2 on the n type Si substrate 4, a pattern of resist 42 is formed on the p type GaAs layer 2 as shown in FIG. 2(a). More specifically, the resist 42 is formed on regions corresponding to the portions 12 of the surface electrode 1 which are physically and electrically separated from the semiconductor layer 2 in FIG. 1(a). The thickness of the resist 42 is approximately 1 micron. Then, as shown in FIG. 2(b), a pattern of resist 43 is formed on a region other than the region where the surface electrode will be formed. This resist 43 is relatively thick, i.e., approximately 5 microns. Then, Ag is evaporated and deposited to a thickness of about 4 microns on the wafer on which the resist patterns are thus formed. When the deposition is performed in this way, the Ag electrode completely covers the resist 42 that is about 1 micron thick but it is broken at the side walls of the resist 43 that is about 5 microns thick. When the resists 42 and 43 are removed in this state, the Ag film on the resist 43 is lifted off together with the resist 43, resulting in a surface electrode pattern as shown in FIG. 2(c). Here, although the resist 42 remains beneath the grid electrode as shown in FIG. 2(c), the effect of the first embodiment of the present invention is not changed because the resist is easily deformed by stress. In addition, the resist 42 may be completely removed.

Figure 3:
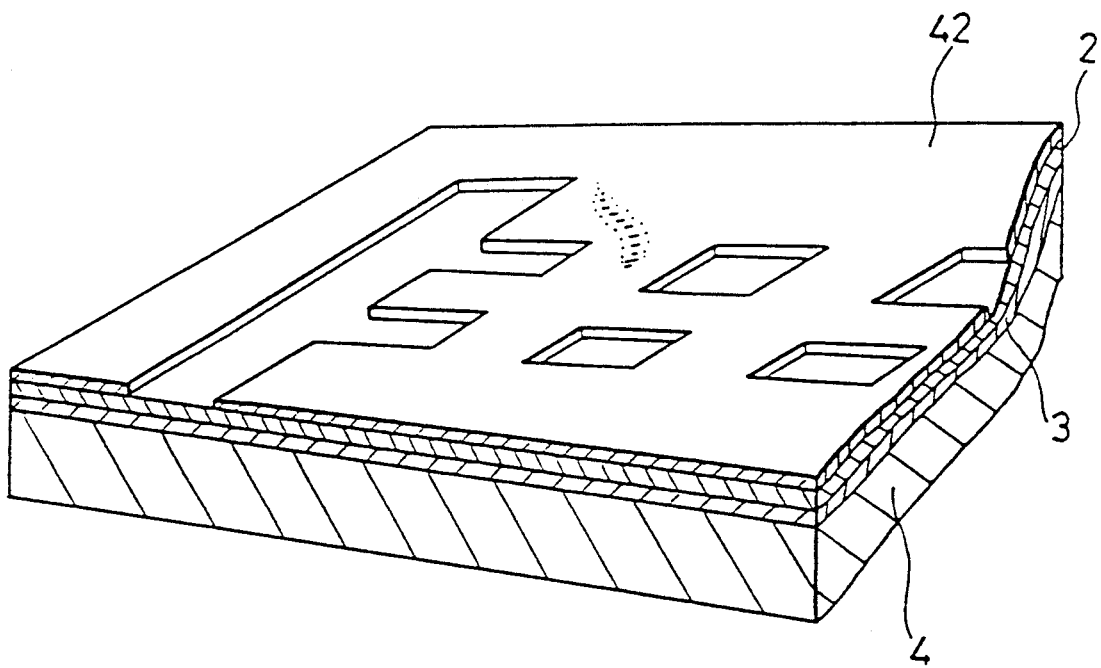
FIG. 3 is a perspective view of another example of a resist pattern used in the step of FIG. 2(a)

While in the above-described production process the pattern of the resist 42 of about 1 micron thickness is arranged dispersedly as shown in FIG. 2(a), the pattern may have apertures at regions where the electrode 1 is physically and electrically connected with the semiconductor layer 2 as shown in FIG. 3.

FIGS. 4(a) to 4(e) are perspective views illustrating another example of a method for producing the upper electrode of the solar cell of FIG. 1(a). In FIGS. 4(a)–(e), the same reference numerals as those shown in FIG. 2(a) designate the same or corresponding parts. Reference numeral 45 designates an Ag film serving as a conductive base layer, numeral 51 designates a resist, and numeral 46 designates a plated layer.

Figure 4A:
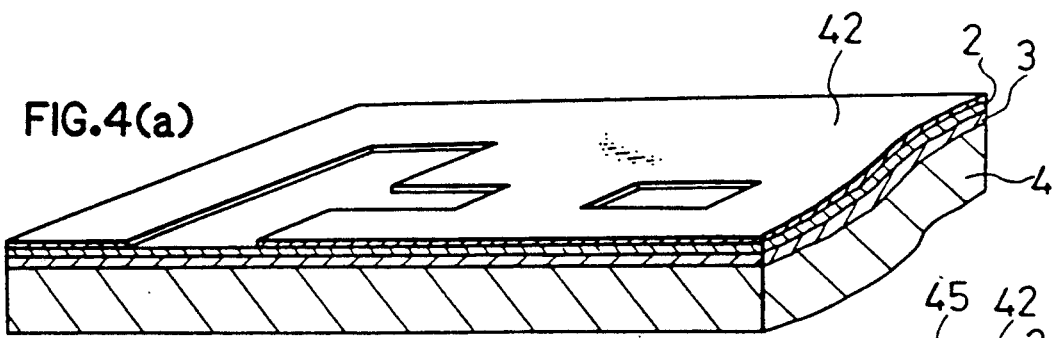
FIGS. 4(a) to 4(e) are perspective views illustrating another example of a method for producing an upper electrode of the solar cell of FIG. 1(a)
Figure 4B:
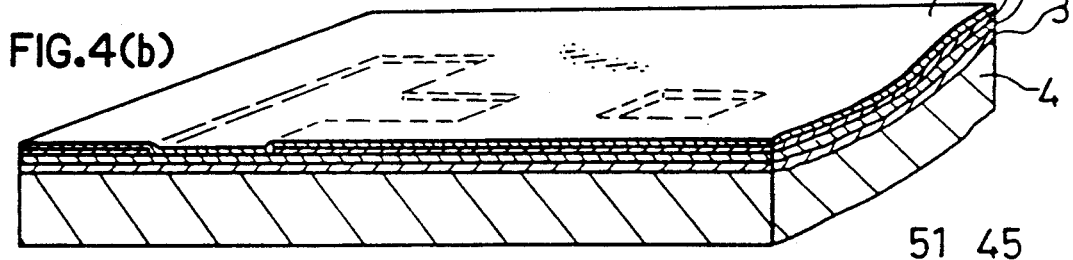
Figure 4C:
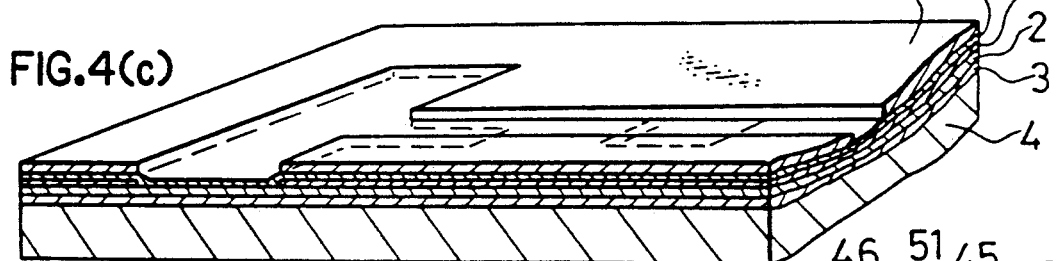
Figure 4D:
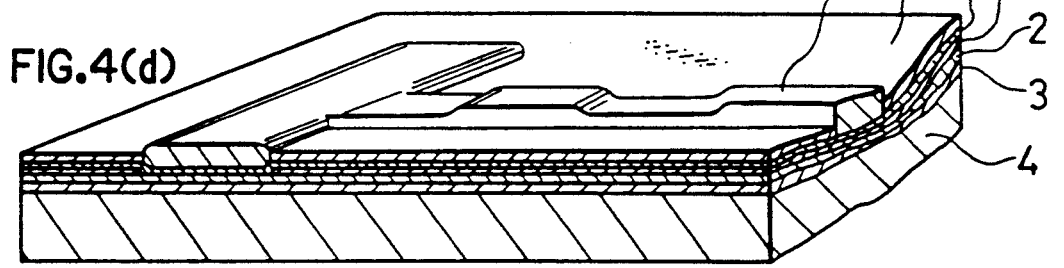
Figure 4E:
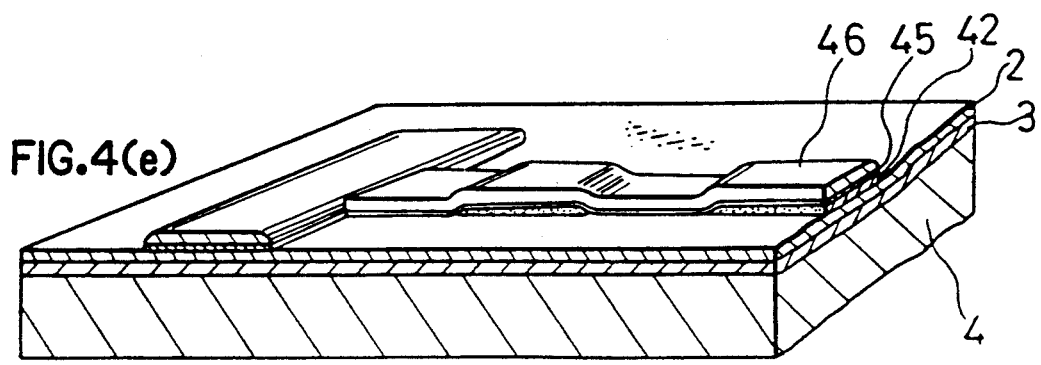

An n type GaAs layer 3 and a p type GaAs layer 2 are successively formed on the n type Si substrate 4. Then, as shown in FIG. 4(a), a pattern of resist 42 having apertures at regions where the surface electrode 1 is physically and electrically connected with the semiconductor layer 2 is formed. The thickness of the resist 42 is 2 to 3 microns. Then, as shown in FIG. 4(b), on the wafer on which such a resist pattern is formed, an Ag conductive base layer 45 having about 0.5 micron thickness is formed by sputtering. Since sputtering has a superior step coverage property as compared with evaporation, the conductive base layer 45 can be formed with no breakage at the edge portions of the resist. Then, as shown in FIG. 4(c), a resist pattern 51 is formed at a region other than regions where the surface electrode will be formed. This resist pattern 51 is used as a mask in a plating process. Thereafter, electrolytic plating is performed to form an Ag layer 46 of about 4 microns thickness on the conductive base layer 45 exposed in the aperture of the resist pattern 51, as shown in FIG. 4(d). Then, the resist 51 is removed and the exposed portions of the AG conductive base layer 45 are removed by ion milling. Here, by the ion milling, the thickness of the Ag electrode layer 46 is also decreased. However, the thickness of the Ag electrode after the ion milling is about 4 microns, causing no problem in the operation of the solar cell. In addition, the above-described decrease of the film thickness is prevented by providing a resist pattern for preventing ion milling of the electrode pattern. Thereafter, the resist 42 formed first is removed, resulting in a surface electrode pattern shown in FIG. 4(e). Here, although the resist 42 remains beneath the grid electrode as shown in FIG. 4(e), the effect of the first embodiment of the present invention is not changed because the resist is easily deformed by stress. In addition, the resist 42 may be completely removed.

Figure 7A:
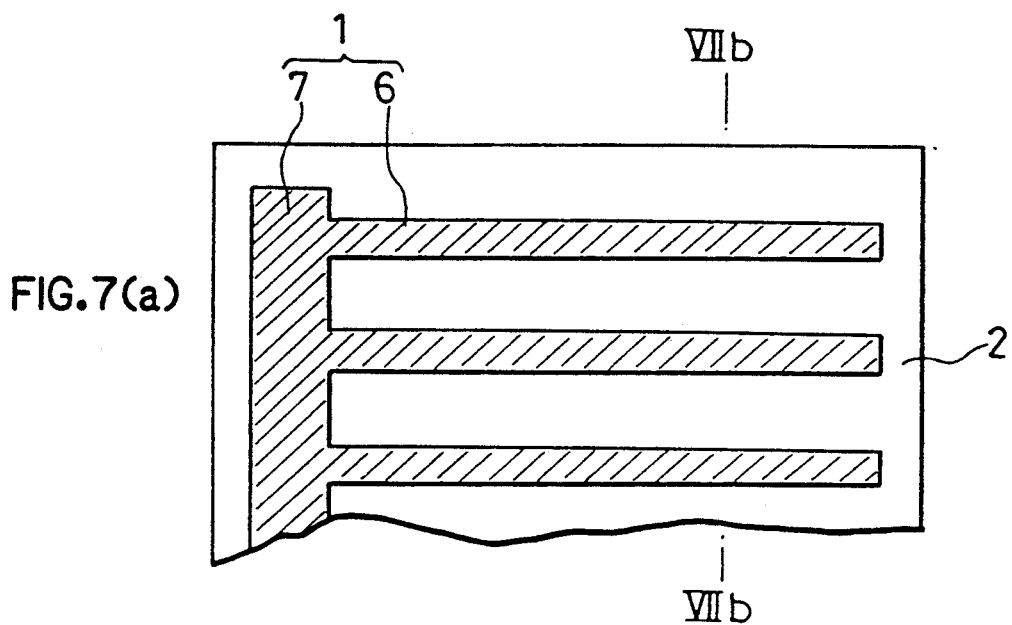
FIGS. 7(a) to 7(c) are a plan view, a cross-sectional view, and a perspective view showing a GaAs solar cell on Si substrate as a semiconductor device in accordance with a second embodiment of the present invention.
Figure 7B:
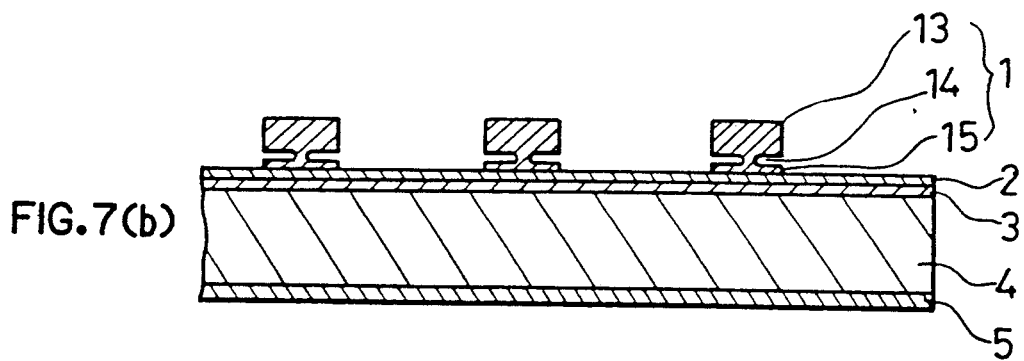
Figure 7C:
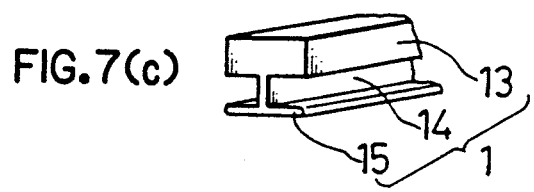

A description is now given of a second embodiment of the present invention. FIG. 7(a) is a plan view showing a GaAs on Si solar cell as a semiconductor device in accordance with the second embodiment of the present invention, and FIG. 7(b) is a cross-sectional view taken along a line VIIb—VIIb of FIG. 7(a). In these figures the same reference numerals as those shown in FIG. 1(a) designate corresponding parts. In this second embodiment, the surface electrode 1 comprises a thin film portion 15 which is physically and electrically connected with the semiconductor layer, a current flowing portion 13, and a portion 14 which connects the thin film portion 15 with the current flowing portion 13. FIG. 7(c) is a perspective view showing a part of the surface electrode 1.

Figure 11A:
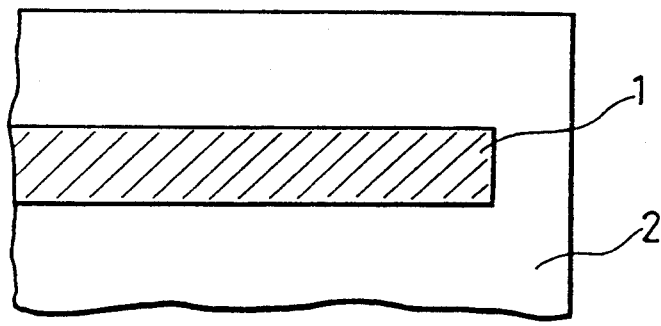
FIGS. 11(a) and 11(b) are plan views showing a configuration of a surface electrode of a solar cell and a distribution of dislocations.
Figure 11B:
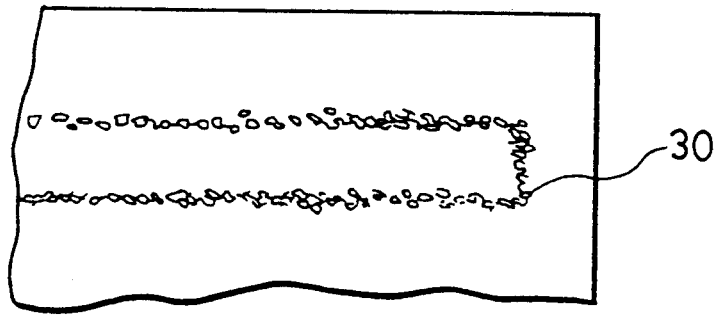
Figure 12A:
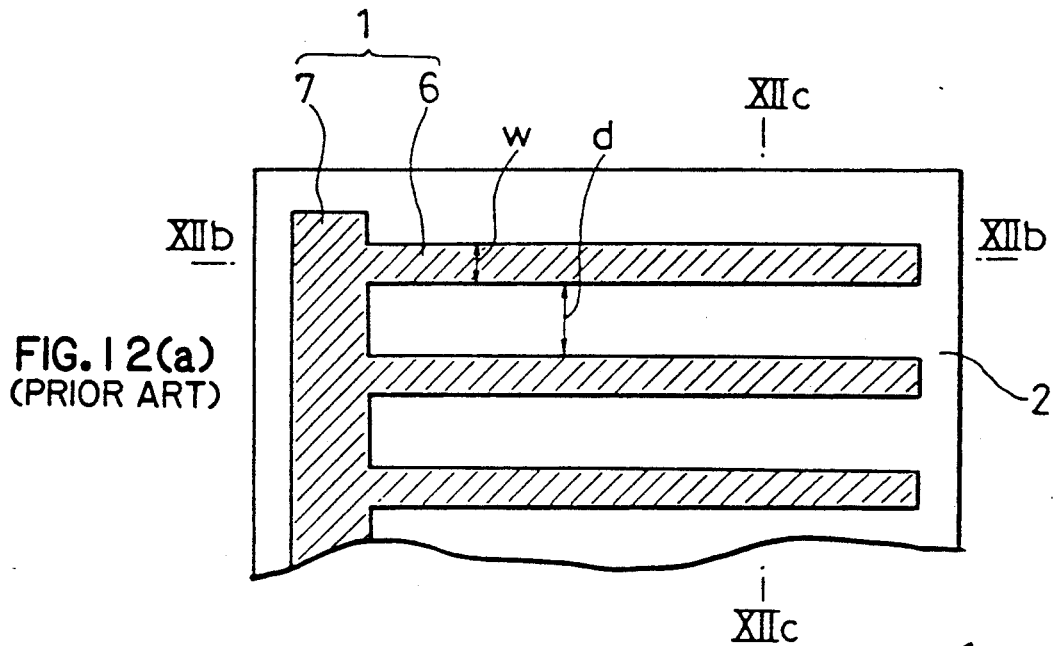
FIGS. 12(a) to 12(c) are a plan view and cross-sectional views showing a structure of a GaAs solar cell on a Si substrate according to the prior art.
Figure 12B:
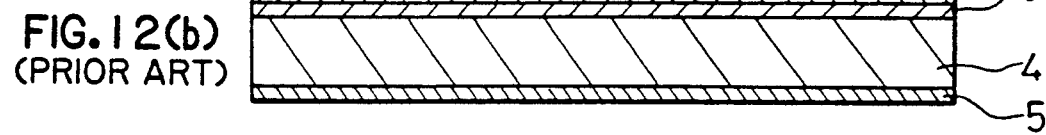
Figure 12C:
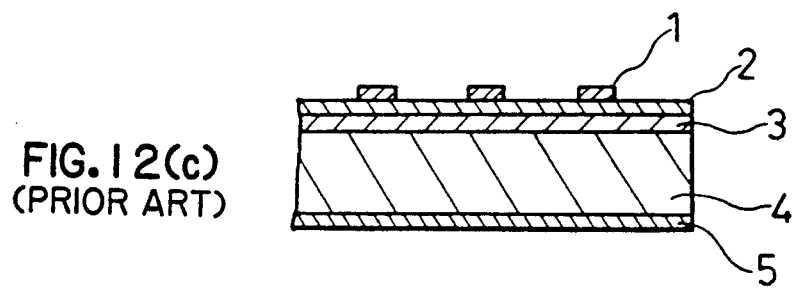

The effect of this second embodiment will be described. In a case where a belt-shaped metal is formed on a semiconductor layer, stress applied to the semiconductor layer by the metal extremely increases at the edge of the electrode. As is disclosed in pp. 4567 to 4579 of *Journal of Applied Physics*, 50(7), the stress applied to the semiconductor layer is in proportion to the product of the stress in the electrode metal $\sigma$ and the metal thickness d, i.e., $\sigma \times d$. In the above reference, a case where a film is removed in belt shape is shown. This is equivalent to a case where a band-shaped film is attached. The stress $\sigma$ depends on the kind of metal or the production method of the electrode metal. In a case where the temperature of the element varies, the stress depends on the difference between thermal expansion coefficients or the difference in hardness between the metal and the semiconductor which are connected with each other. FIGS. 11(a)–(b) show a case where the stress applied by the electrode concentrates at the edge of the electrode and this stress deteriorates the crystallinity of the semiconductor layer. FIG. 11(a) shows a GaAs solar cell having the same electrode structure as that of the prior art shown in FIG. 12(a), in which crystalline defects are generated by stress. FIG. 11(a) is a plan view showing a part of the solar cell including an electrode, and FIG. 11(b) is a plan view showing a distribution of etch pits corresponding to dislocations, as a result of a KOH (potassium hydroxide) etching performed after removing the electrode of FIG. 11(a). In these figures, reference numeral 2 designates a GaAs crystalline film, numeral 1 designates an electrode formed on the crystalline surface, and numeral 30 designates etch pits formed corresponding to dislocations. It is found from the distribution of etch pits shown in FIG. 11(b) that many dislocations are generated at the edge of the electrode. When dislocations occur in the crystalline film and the quality of the crystalline film is deteriorated, leakage current increases, inviting a reduction in conversion efficiency.

In FIG. 11(a), the electrode formed by evaporation is subjected to an annealing at 400° C. for 15 minutes to make an ohmic contact with GaAs. During the annealing, a thermal stress is applied to the GaAs layer by the electrode and dislocations are generated in the GaAs layer at the edge of the electrode. It is found from FIG. 11(b) that it is important to relieve the stress at the edge of the electrode to prevent deterioration of crystalline quantity.

In order to decrease the thermal stress applied by the electrode (especially by the edge of the electrode), the electrode thickness d is required to be substantially reduced because the stress is proportional to this thickness d.

In the second embodiment of the present invention, the portion 15 which is electrically connected to the semiconductor is thin as shown in FIG. 7(b). Therefore, even when the temperature of the element varies, the thermal stress generated at the edge of the electrode can be greatly reduced by the effect of the extremely thin electrode. This portion 15 has such an area that invites no reduction in efficiency caused by the contact resistance between the metal and the semiconductor. Accordingly, photocurrent generated in the GaAs layer can be collected by the portion 15. This photocurrent is introduced into the current flowing portion 13 having a large cross-section through the constricted portion 14 and flows through the grid 6 to be collected at the bus 7. In addition, when the temperature of the element varies, the difference in deformation amount between the current flowing portion 13 and the GaAs layer 2 arises due to a difference in thermal expansion coefficients between the portion 13 and the layer 2, this difference is absorbed by the constricted portion 14 because the portion 14 has a high degree of freedom against mechanical deformation, i.e., it easily deforms in a longitudinal direction of the grid when stress is applied thereto. Accordingly, in the electrode structure shown in FIG. 7(a), an electrode that suppresses the stress applied to the semiconductor layer by the electrode to a minimum extent, that has small semiconductor-metal contact resistance, and that has small electrical resistance in longitudinal direction of the grid, is realized. Therefore, no dislocations are generated in the semiconductor layer beneath the electrode, so that the crystalline quality is not deteriorated. In addition, warping (deformation) of the element caused by variation in temperature can be suppressed.

A description is now given of the production method in accordance with the second embodiment of the present invention. FIGS. 8(a) to 8(g) are cross-sectional views of process steps for producing the electrode of the solar cell shown in FIG. 7(a). In FIG. 8, reference numeral 21 designates a solar cell substrate on which a photovoltaic layer is formed. Reference numerals 22a to 22c designate resist patterns, numerals 23a and 23b designate metal films, and numeral 24 designates a plated metal layer.

As shown in FIG. 8(a), a resist pattern 22a is formed on the substrate 21. Then, as shown in FIG. 8(b), a metal film 23a of about 0.1 micron thickness is formed by evaporation using the resist pattern 22a as a mask. Thereafter, the resist 22a is removed, providing electrode segments 23a corresponding to the portions 15 in FIG. 7(a) which are electrically connected to the semiconductor layer. Then, as shown in FIG. 8(d), a resist pattern 22b having stripe-shaped apertures in which the electrode segments 23a are exposed is formed. Then, as shown in FIG. 8(e), a metal film 23b electrically connected to the electrode metal 23a is formed on the entire surface of the wafer by evaporation. Then, a resist pattern 22c having the same aperture pattern as that of the resist pattern 22a is formed on the metal film 23b and then electrolytic plating is performed using the metal film 23b as a conductive base layer, resulting in a plated metal layer 24 having about 4 microns thickness shown in FIG. 8(f). Thereafter, the resist pattern 22c is removed, and the exposed metal film 23b is also removed by such as ion milling, and furthermore the resist pattern 22b is removed, resulting in an upper electrode configuration as shown in FIG. 8(g).

In the electrode thus obtained, the thickness of the electrode metal corresponding to the portion 15 which is electrically connected to the semiconductor layer is about 0.1 micron, i.e., about one fortieth of that of the prior art structure. Therefore, the stress at the edge of the electrode is suppressed to about one fortieth of that of the prior art.

Figure 9A:
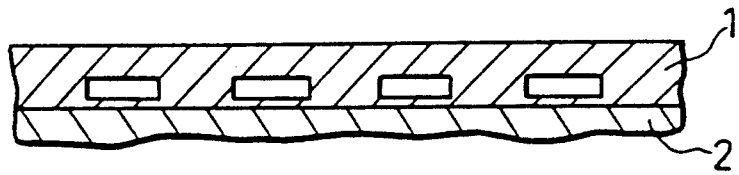
FIGS. 9(a) to 9(c) are diagrams showing a modification of the GaAs solar cell on a Si substrate of FIG. 7.
Figure 9B:
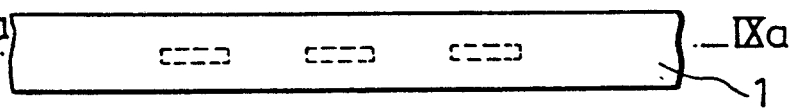
Figure 9C:
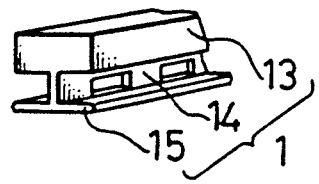
Figure 10A:
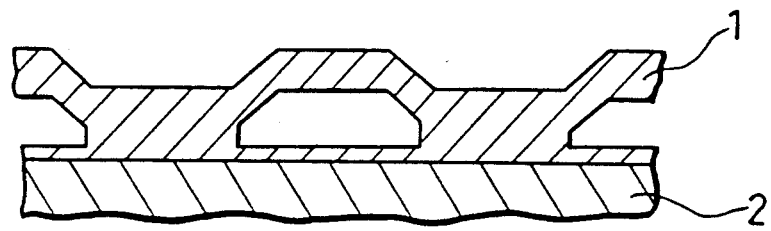
FIGS. 10(a) to 10(c) are diagrams showing another modification of the GaAs solar cell on a Si substrate of FIG. 7.
Figure 10B:
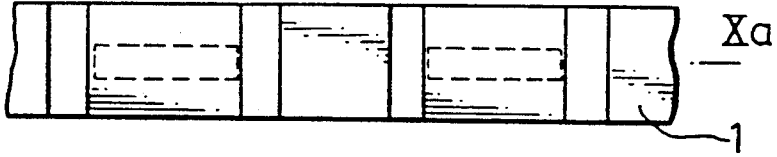
Figure 10C:
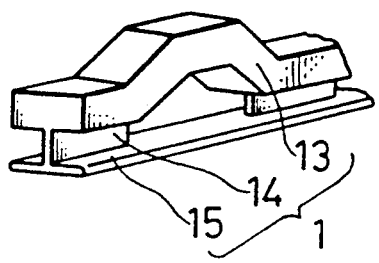

While in the above described second embodiment the portion 14 which electrically connects the current flowing portion 13 with the portion 15 electrically connected to the semiconductor layer is continuously provided, this portion may be provided periodically as shown in FIGS. 9(a)-(c). In addition, when an electrode structure of the first embodiment is combined with that of the second embodiment as shown in FIGS. 10(a)-10(c), a synergism of these two embodiments is achieved.

While in the above-described first and second embodiments a GaAs on Si solar cell is employed, solar cells comprising other materials may be employed. Furthermore, the present invention can be also applied to optical devices such as photodiodes, lasers or the like, or electron devices such as IC circuits, LSI circuits or the like, with the same effects as described above.

As is evident from the foregoing description, according to the present invention, a metal electrode on a crystalline semiconductor film comprises portions electrically connected with a crystalline surface and portions electrically separated from the crystalline surface and having configurations that enable easy deformation of the entire configuration of the metal electrode. These portions are alternatingly arranged on the surface of the semiconductor crystal. Therefore, a stress applied by the electrode to the semiconductor layer beneath the electrode is reduced and deformation of the semiconductor element due to thermal stress is prevented, thereby preventing deterioration of electrical characteristics.

In accordance with another aspect of the present invention, a metal electrode on a crystalline semiconductor film comprises a thin film metal provided directly on the semiconductor crystalline surface, an electrode metal having a large cross-section, and a metal part narrower than the thin film metal which electrically connects the thin film metal with the electrode metal. The portion of the electrode which is directly in contact with the semiconductor is extremely thin. Therefore, the stress applied to the semiconductor by the electrode edge is reduced and deterioration of the crystallinity is prevented, thereby preventing deterioration of electrical characteristics.

What is claimed is:

1. A semiconductor device having a metal electrode disposed on a crystalline semiconductor, comprising:
   a crystalline semiconductor film having a surface; and
   a metal electrode including a first thin film portion disposed directly on said surface of said semiconductor film, a second portion having a large cross-section compared to said first portion, and a third portion electrically connecting said first portion with said second portion and narrower in width than said first portion.

2. A solar cell comprising:
   a first conductivity type semiconductor substrate;
   a first conductivity type semiconductor crystalline layer and a second conductivity type semiconductor crystalline layer successively disposed on said substrate, said second conductivity type semiconductor crystalline layer having a surface for receiving incident light;
   a comb-shaped electrode comprising a plurality of grid finger electrodes and a bus disposed on said surface of said second conductivity type semiconductor crystalline layer;
   a rear electrode disposed on said first conductivity type semiconductor substrate, each of said grid finger electrodes comprising a first thin film portion disposed directly on said surface of said second conductivity type semiconductor crystalline layer, a second portion having a large cross-section compared to said first portion, and a third portion electrically connecting said first portion with said second portion and narrower in width than said first portion.

3. The solar cell as defined in claim 2 wherein said first portion collects current from said semiconductor crystalline layers, said third portion conducts the collected current to said second portion, and said third portion conducts the current to the bus.

4. The solar cell as defined in claim 2 wherein said first conductivity type semiconductor substrate is n type Si, said first conductivity type semiconductor crystalline layer is n type GaAs, and said second conductivity type crystalline layer is p type GaAs.

5. The solar cell as defined in claim 4 wherein said comb-shaped electrode comprises copper.

6. The solar cell as defined in claim 5 wherein the thickness of said first thin portion is approximately 0.1 micron.

7. The solar cell as defined in claim 2 wherein said second portion is periodically missing along a longitudinal direction of the grid finger electrodes.

8. The solar cell as defined in claim 7 wherein said second portion has a configuration that can be easily deformed where said third portion is missing.

* * * * *